United States Patent
Brooks

(10) Patent No.: US 6,900,549 B2
(45) Date of Patent: May 31, 2005

(54) SEMICONDUCTOR ASSEMBLY WITHOUT ADHESIVE FILLETS

(75) Inventor: Jerry M. Brooks, Caldwell, ID (US)

(73) Assignee: Micron Technology, Inc., Boise, ID (US)

( * ) Notice: Subject to any disclaimer, the term of this patent is extended or adjusted under 35 U.S.C. 154(b) by 46 days.

(21) Appl. No.: 09/760,741

(22) Filed: Jan. 17, 2001

(65) Prior Publication Data

US 2002/0094608 A1 Jul. 18, 2002

(51) Int. Cl.[7] .......................... H01L 23/48; H01L 23/52; H01L 29/40
(52) U.S. Cl. ................. 257/783; 257/685; 257/686; 257/777; 257/707; 438/108; 438/109; 361/760
(58) Field of Search ..................... 257/783, 686, 257/685, 707, 777; 438/108, 109; 361/760

(56) References Cited

U.S. PATENT DOCUMENTS

| | | | | |
|---|---|---|---|---|
| 5,291,061 A | * | 3/1994 | Ball ............................ | 257/686 |
| 5,422,435 A | | 6/1995 | Takiar et al. | |
| 5,489,752 A | * | 2/1996 | Cognetti et al. ............ | 174/266 |
| 5,629,566 A | * | 5/1997 | Doi et al. .................... | 257/789 |
| 5,663,530 A | * | 9/1997 | Schueller et al. ........... | 174/260 |
| 5,696,031 A | * | 12/1997 | Wark .............................. | 438/4 |
| 5,726,492 A | * | 3/1998 | Suzuki et al. ................ | 257/685 |
| 6,075,712 A | * | 6/2000 | McMahon .................... | 361/783 |
| 6,100,594 A | * | 8/2000 | Fukui et al. .................. | 257/777 |
| 6,132,226 A | * | 10/2000 | Noda ........................... | 439/91 |
| 6,133,626 A | * | 10/2000 | Hawke et al. ............... | 257/686 |
| 6,181,002 B1 | * | 1/2001 | Juso et al. .................... | 257/686 |
| 6,207,474 B1 | * | 3/2001 | King et al. .................. | 438/107 |
| 6,321,976 B1 | * | 11/2001 | Lo et al. ................... | 228/180.5 |
| 6,333,562 B1 | * | 12/2001 | Lin .............................. | 257/777 |
| 6,459,147 B1 | * | 10/2002 | Crowley et al. ............. | 257/692 |
| 6,534,874 B1 | * | 3/2003 | Matsumura .................. | 257/777 |

FOREIGN PATENT DOCUMENTS

| | | | | | |
|---|---|---|---|---|---|
| JP | 08241940 A | * | 9/1996 | ........... | H01L/23/34 |
| JP | 10256470 A | * | 9/1998 | | |
| JP | 2000124395 A | * | 4/2000 | | |
| JP | P2001-94045 A | * | 4/2001 | | |

* cited by examiner

*Primary Examiner*—George Eckert
*Assistant Examiner*—Chris Chu
(74) *Attorney, Agent, or Firm*—Dickstein Shapiro Morin & Oshinsky LLP

(57) ABSTRACT

Disclosed is a method for forming a semiconductor assembly and the resulting assembly in which a flowable adhesive material which secures a die to a support and does not form an adhesive fillet. A flowable adhesive is deposited between the die and support so that it covers about 50 to about 90 percent of the bottom surface area of the die after the die is mounted to the support. The reduced surface coverage area prevents formation of an adhesive fillet.

17 Claims, 5 Drawing Sheets

SEMICONDUCTOR ASSEMBLY WITHOUT ADHESIVE FILLETS

FIELD OF THE INVENTION

The present invention relates to a structure and method of forming a semiconductor assembly using adhesive materials to secure semiconductor dies to support elements without forming adhesive fillets.

BACKGROUND OF THE INVENTION

In order to reduce the size of semiconductor devices numerous techniques have been developed to vertically stack one semiconductor die, hereinafter "die", on top of another die. FIG. 1 illustrates a conventional method of vertically stacking two die 20, 30 on a support structure 10, such as a printed circuit board (PCB) or other thin support structure, to form a conventional semiconductor assembly 100. The first die 20 is shown secured to a support structure 10 by an adhesive material 22$_a$ using techniques well known in the art. When the first die 20 is pressed against the support structure 10 the adhesive material 22$_a$ is partially forced outside the die's 20 perimeter 29 and forms an adhesive fillet 24$_a$. Likewise, when the second die 30 is secured against the first die 20 by an adhesive material 22$_b$ a second adhesive fillet 24$_b$ is also formed.

Both the first die 20 and second die 30 are shown wire bonded 40 to an electrical contact area 18 on the support structure 10. The first die 20 has an electrical contact area 28, such as a bonding pad, on its top surface 26. Because adhesive fillet 24$_b$ is formed when the second die 30 is secured to the first die 20, it Limits the placement of the first die's 20 electrical contact area 28. The distance B between the perimeter 39 of the second die 30 and a first die's 20 electrical contact area 28 must be increased by distance A, the width of the adhesive fillet 24$_b$, to provide sufficient operating space for the wire bonding equipment. Typical dimensions for distances B are about 428 microns or greater to allow for adhesive fillets 24$_b$, which are conventionally about 228 microns in width or greater. Using current wire bonding equipment, distance B between electrical contact area 28 and the perimeter of the fillet 24$_b$ can be reduced to about 200 microns or less. In other words, adhesive fillet 24$_b$ requires about 228 microns or more of first die's 20 top surface 26 on each side of the first die 20. If the adhesive fillet 24$_b$ were eliminated the space could be used either to increase the size of the second die 30 or to reduce the size of the first die 20.

An alternative method of stacking dies 20, 30 to a support structure 10 to form a semiconductor assembly involves using an adhesive film sized and aligned with the respective die 20, 30 perimeters. Since the adhesive film is cut or dimensioned with the second die's perimeter 39, no adhesive fillet 24, as described above, is formed. However, adhesive films are expensive and are difficult to align with the dies 20, 30 and support structure 10. Accordingly, there is a need and desire for an easy, low-cost method of securing one or more semiconductor dies 20, 30 to various support structures 10 to form a semiconductor assembly 100 using adhesive materials 22 such that no adhesive fillets 24 are produced, for example, when a second die 30 is pressed and secured to a first semiconductor die 20 and when a first semiconductor die 20 is pressed and secured to a support structure 10.

SUMMARY OF THE INVENTION

The present invention provides a method to vertically stack at least one semiconductor die on top of another semiconductor die using an adhesive material without forming an adhesive fillet at the second die's perimeter. An adhesive material is deposited over about 50% to about 90% of the top surface of the first semiconductor die, such that when the second die is secured against the adhesive material and first die no adhesive material extends past the perimeter of the second die. Because no adhesive fillet is formed, the distance between the electrical contact areas on top of the first semiconductor die and the perimeter of the second die can be reduced.

BRIEF DESCRIPTION OF THE DRAWINGS

The foregoing and other advantages and features of the invention will become more apparent from the detailed description of the preferred embodiments given below with reference to the accompanying drawings in which.

DETAILED DESCRIPTION OF THE PREFERRED EMBODIMENTS

The invention provides a method and resulting structure for a semiconductor assembly with no adhesive fillet formed when a semiconductor die is secured by adhesive to a supporting structure. The invention will be described as set forth in the exemplary embodiments of the detailed description and as illustrated in FIGS. 2–7. These embodiments are described with sufficient detail to enable those skilled in the art to practice the invention, and it is to be understood that other embodiments may be employed, and that structural changes may be made without departing from the spirit or scope of the invention. The invention is not limited by the description of the exemplary embodiments.

Figure 2:
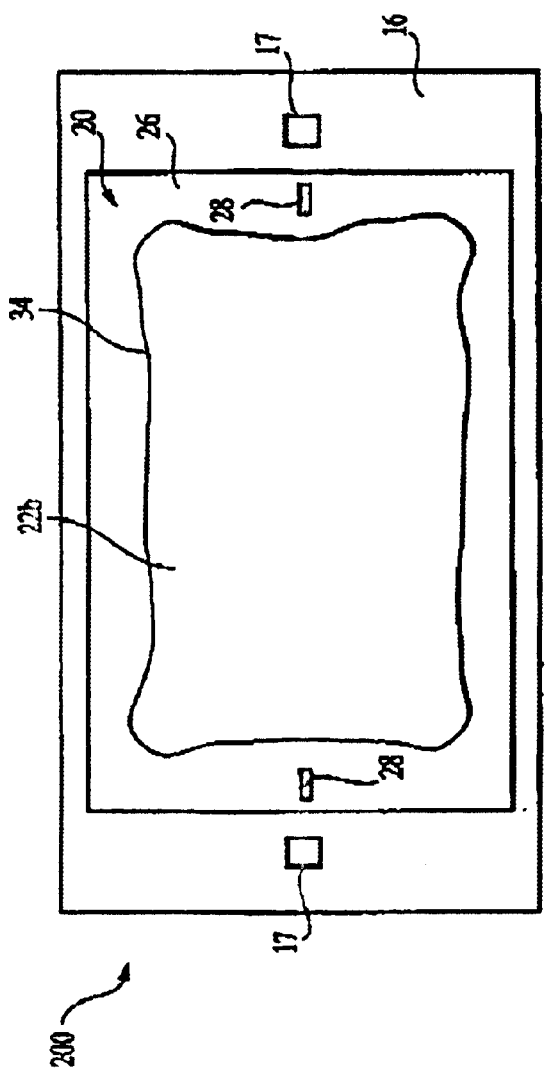
FIG. 2 is a plan view of a partially fabricated semiconductor die stack on a support structure according to the present invention.
Figure 3:
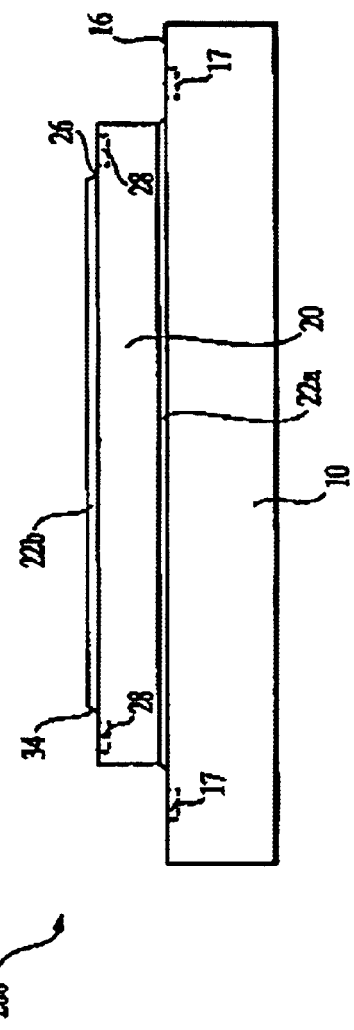
FIG. 3 is an elevation view of FIG. 2.

Referring now to the drawings, where like elements are designated by like reference numerals, FIGS. 2–3, illustrate a plan and elevation view respectively of a partially completed semiconductor assembly 200 in which a first semiconductor die 20 is secured to the top surface 16 of supporting structure 10, by a first adhesive layer 22$_a$. Supporting structure 10 in an exemplary embodiment is a printed circuit board or thin film, but may be any structure suitable for supporting a semiconductor die. The supporting structure 10 is shown as having two electrical contact areas 17 on surface 16 and the first die 20 is also shown as having two electrical contact areas 28. It is to be understood that any number of electrical contact areas 17, 28 may be provided on the support structure 10 and first die 20. Also, although FIG. 2 shows the contact areas 17, 28 as recessed, they may also be formed on the surface of the support structure 10 or first die 20, respectively, and could be electrically connected to external electrical paths or to other parts of the completed semiconductor assembly 200.

A second adhesive layer $22_b$ is shown in FIG. 2 as deposited on a top surface 26 of the first semiconductor die 20 within an adhesive layer area defined by a perimeter 34. The second adhesive layer $22_b$ can be deposited by techniques well-known in the art to include various patterns and coverage areas. It is to be understood that perimeter 34 is representative of an area of deposition of the second adhesive layer $22_b$; however it is not limiting. In accordance with the invention a sufficient amount of adhesive material should be deposited to adequately secure a second semiconductor die 30 (see FIGS. 4–5) to the first semiconductor die 20. The invention includes any coverage area or pattern that does not exceed the perimeter of the second die 30. As described below, when the second die 30 is placed and pressed on the first die 20, the adhesive layer $22_b$ represented inside of the adhesive perimeter 34 does not extend past the profile or perimeter 39 of the second die 30 (FIGS. 4–5).

Figure 4:
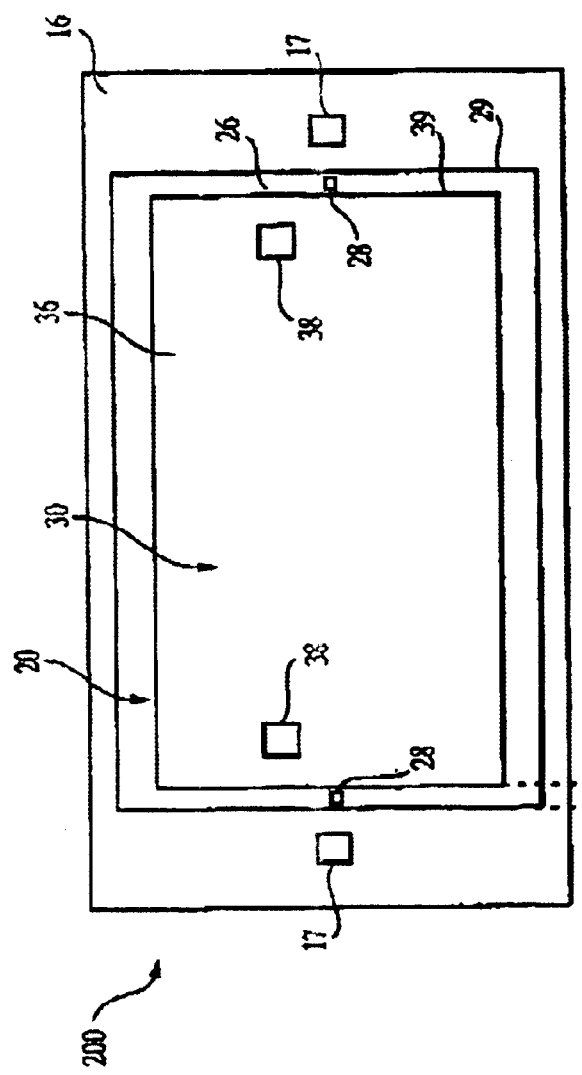
FIG. 4 is a plan view of a partially fabricated semiconductor die stack at a stage of processing subsequent to that shown in FIGS. 2 and 3.
Figure 5:
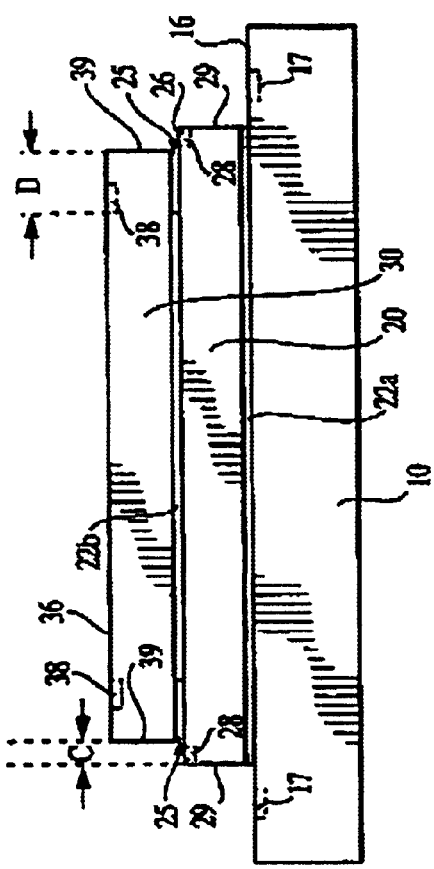
FIG. 5 is an elevation view of FIG. 4.

FIGS. 4–5 show the assembly 200 after a second die 30 with electrical contact areas 38 on the die's top surface 36 is pressed against the second adhesive layer $22_b$ located on the top surface 26 of the first die 20. A cavity 25 is formed between the dies 20 and 30 and is characterized by a distance D between the perimeter 34 of the second adhesive layer $22_b$ and the perimeter 39 of the second die 30. The distance D may be a regular or irregular distance around the periphery of the adhesive layer $22_b$. It is to be understood that formation of cavity 25 is not essential, what is important is that adhesive layer $22_b$ does not extend beyond the perimeter 39 of the second die 30 such that no adhesive fillet $24_b$ is formed.

Figure 6:
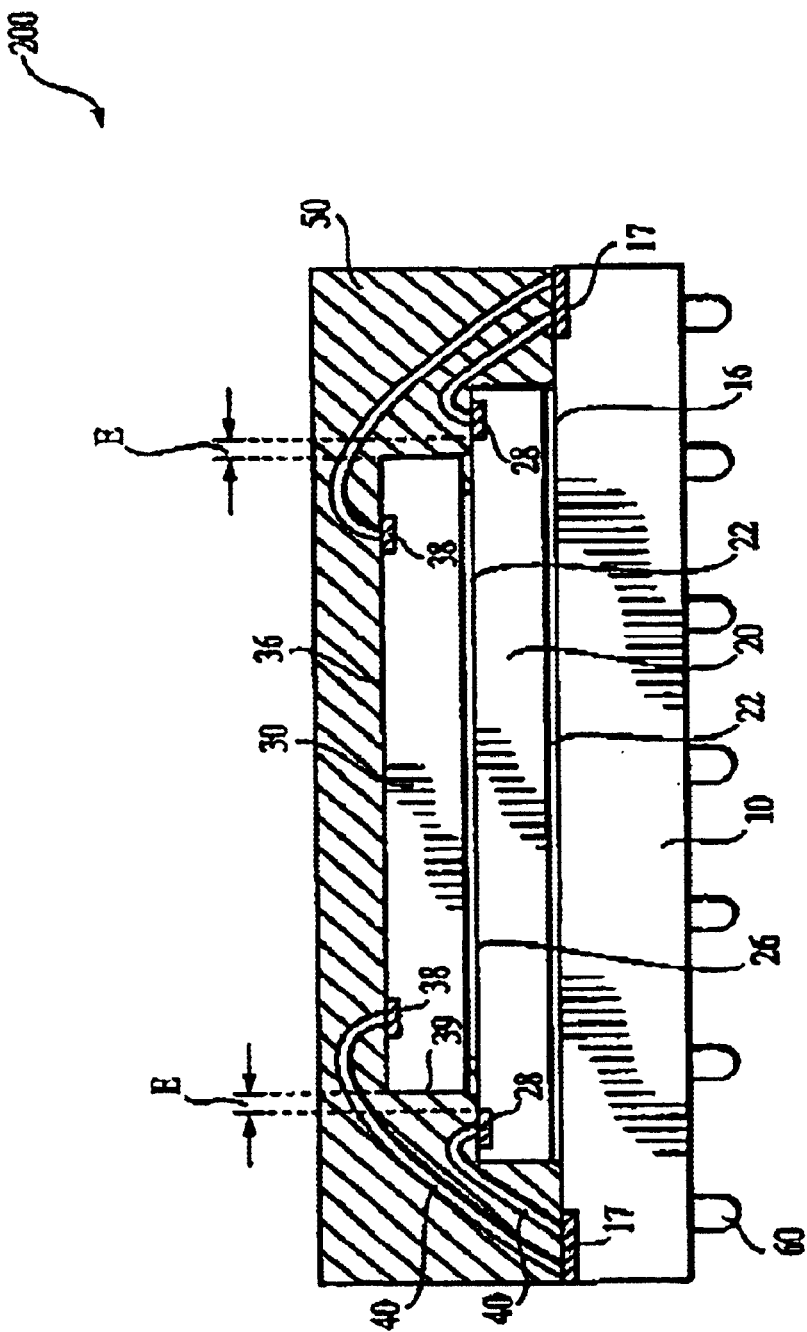
FIG. 6 is a cross-sectional illustration of an encapsulated semiconductor die stack formed according to a method of the present invention.

If cavity 25 is present, the distance D is preferably in the range such that between about 50 and about 90 percent of the second die 30 bottom surface is covered by the second adhesive material layer $22_b$. FIGS. 4 and 5 show distance C between the perimeter 39 of the second die 30 and the perimeter 29 of the first die 20. This distance is a value which provides acceptable clearance between electrical contact area 28 and the second die 30 to enable the formation of electrical contacts between the dies 20, 30 and other parts of the assembly 200 such as wire bonds 40 between the dies 20, 30 and the support structure 10 (FIG. 6). An exemplary distance C between the perimeters 29, 39 of the first die 20 and second die 30 is about 200 microns or less. The distance C is currently only limited by the technology of the wire bond equipment and the minimum required operating space.

FIG. 6 is a cross-sectional illustration of the semiconductor assembly 200 after electrical connections 40 have been made between the respective electrical contact areas 28 and 38 of the first die 20 and second die 30 and electrical contact areas 17 of the support structure 10. In an exemplary embodiment, wire bonding is used for these connections. As illustrated, the dies 20, 30 are stacked and positioned in such a manner that at least one of the electrical contact areas 28, 38 for each die 20, 30 is exposed and accessible for making the electrical connection. Illustrated distance E represents the distance between the first die's electrical contact area 28 and the perimeter 39 of the second die 30.

Also shown are balls 60 which make up a ball grid array pattern for making electrical connections between the support structure 10 and external electrical circuits. The balls 60 are deposited on the support structure 10 using materials and techniques well known in the art and are electrically connected through conductors supported by support structure 10 to the contact areas 17. It is to be understood that multiple semiconductor assemblies 200 could be prepared at one time on a continuous support structure 10, which could be separated into individual or multiple semiconductor assemblies 200 at a later stage of fabrication.

FIG. 6 also shows an encapsulating material 50, such as a molding compound, deposited over the wire bonds 40, semiconductor dies 20, 30, and top surface 16 of the support structure 10. As an exemplary illustration, some of the encapsulation material 50 is shown under the second die 30 and within cavity 25 (FIGS. 4–5) and provides support and stability to the second die 30. The encapsulating material 50 and molding techniques using it are well known in the art and not repeated herein.

Figure 1:
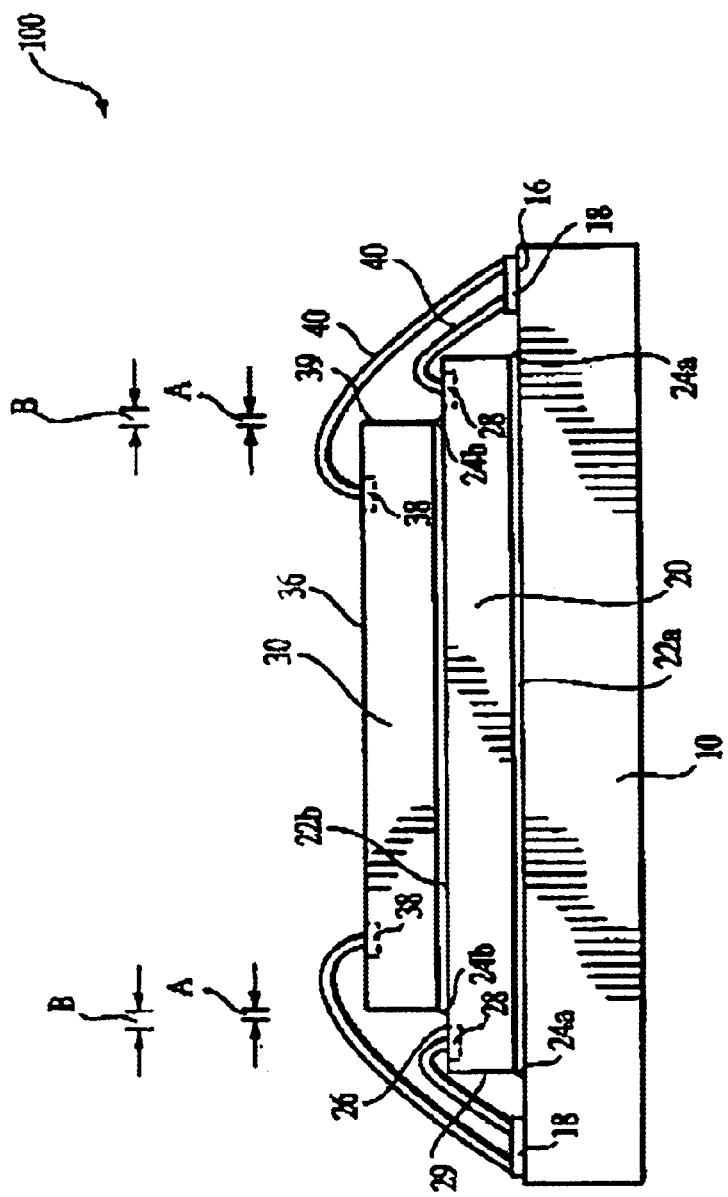
FIG. 1 is an illustration of a conventional structure in which two stacked semiconductor die are secured to a support structure by an adhesive material.
Figure 7:
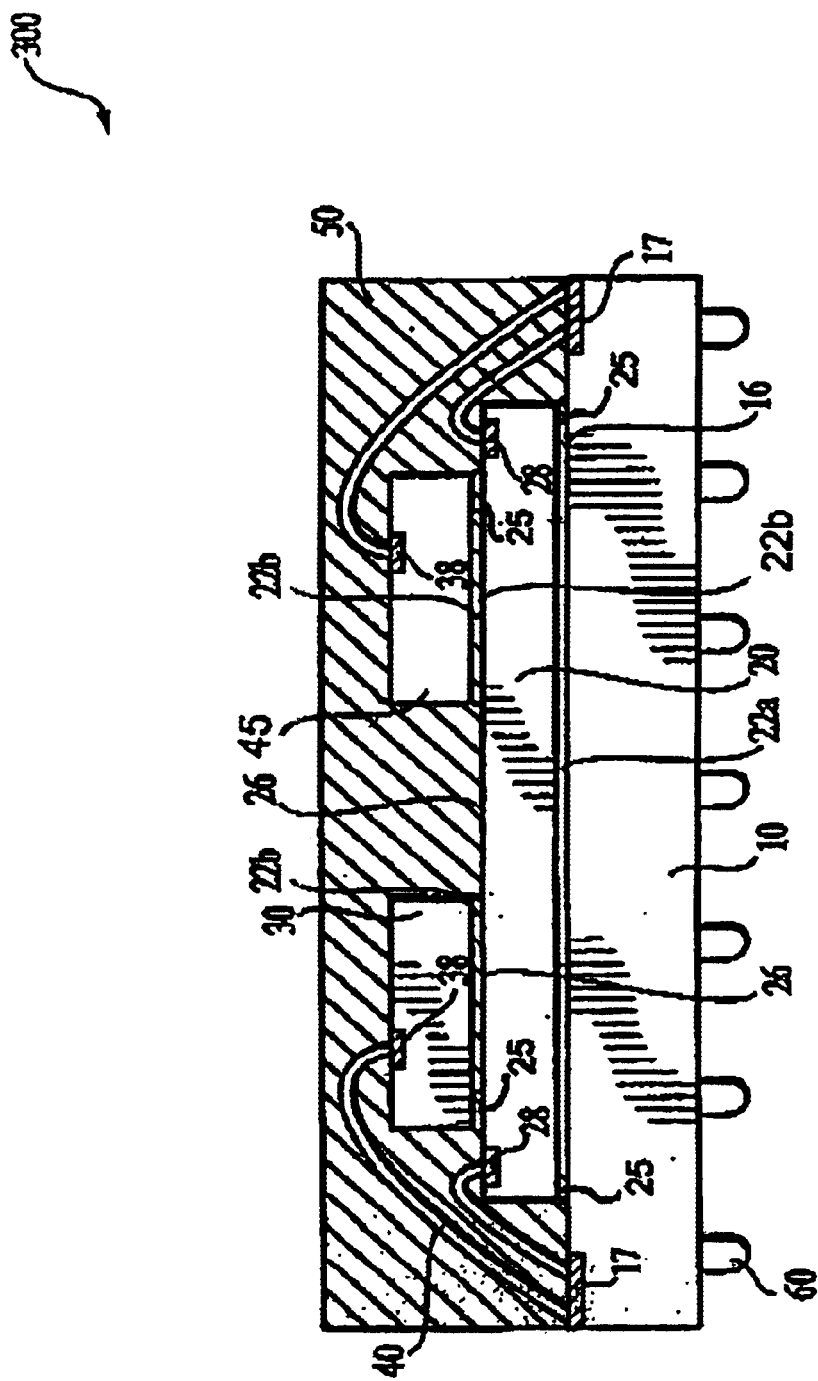
FIG. 7 is an exemplary embodiment of two semiconductor dies stacked on top of a semiconductor die according to a method of the present invention.

FIG. 7 is a cross-sectional illustration of a second exemplary embodiment of a semiconductor assembly 300 with second and third semiconductor dies 30, 45 secured to a first semiconductor die 20 using the techniques described above. It is to be understood that the elimination of the adhesive fillet $24_b$ as discussed in FIG. 1 covers a wide range of semiconductor configurations involving multiple dies with various sizes, dimensions, and electrical contact techniques. The above described invention has the advantage of allowing either the size of the second and third semiconductor dies 30, 45 to be increased or allowing the size of the first semiconductor die 20 to be reduced by eliminating the wasted space occupied by the adhesive fillet $24_b$.

Having thus described in detail the exemplary embodiments of the invention, it is to be understood that the invention defined by the appended claims is not to be limited by particular details set forth in the above description as many apparent variations thereof are possible without departing from the spirit or scope of the invention. Accordingly, the above description and accompanying drawings are only illustrative of exemplary embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. A semiconductor assembly comprising:
   a first semiconductor die with a top and bottom surface;
   at least one second semiconductor die having a perimeter, including four sides, and a top and bottom surface, said bottom surface having a smaller area than said top surface of said first semiconductor die, said at least one second semiconductor die being secured at its bottom surface to said top surface of said first semiconductor die by a flowable adhesive material which does not extend past any one of the sides of said perimeter of said at least one second semiconductor die, said top surface of said first semiconductor die having at least one electrical contact area at a distance outside said perimeter of said at least one second semiconductor die, said at least one second semiconductor die being in electrical communication with said at least one electrical contact area; and
   an encapsulating material for encapsulating said at least one second semiconductor die, electrical communication, and at least a portion of said first semiconductor die, said encapsulating material filling a space between said bottom surface of said at least one second semiconductor die and said top surface of said first semiconductor die.

2. The semiconductor assembly of claim 1, wherein said flowable adhesive material is an epoxy.

3. The semiconductor assembly of claim 1, wherein said flowable adhesive material covers an area less than or equal to about 90% of said at least one second semiconductor die bottom surface area.

4. The semiconductor assembly of claim 3, wherein said flowable adhesive material covers an area greater than or equal to about 50% of said at least one second semiconductor die bottom surface area.

5. The semiconductor assembly of claim 1, wherein a distance between said electrical contact area and said perimeter of said at least one second semiconductor die is less than or equal to about 428 microns and greater than zero microns.

6. The semiconductor assembly of claim 5, wherein a distance between said electrical contact area and said perimeter of said at least one second semiconductor die is less than or equal to about 200 microns and greater than zero microns.

7. The semiconductor assembly of claim 1, wherein said electrical communication is through a wire bond.

8. The semiconductor assembly of claim 1, wherein said at least one electrical contact area is a bonding pad.

9. A semiconductor assembly comprising:
 a first semiconductor die having a top and a bottom surface;
 a second semiconductor die having a perimeter, including four sides, and a top and bottom surface, said bottom surface having a smaller area than said top surface of said first semiconductor die, said second die being secured at its bottom surface to said top surface of said first semiconductor die by a flowable adhesive material which does not extend past any one of the sides of said perimeter of said second semiconductor die such that there is a cavity along at least a portion of said perimeter between said first semiconductor die and said second semiconductor die;
 wherein said top surface of said first semiconductor die has at least one electrical contact area positioned at a location exterior to said perimeter of said second semiconductor die, said second semiconductor die being in electrical communication with said electrical contact area, arid wherein a distance between said electrical contact area and said perimeter of said second semiconductor die is less than or equal to about 428 microns and greater than zero microns; and
 an encapsulating material for encapsulating said at least one second semiconductor die, electrical communication, and at least a portion of said first semiconductor die, said encapsulating material filling said cavity.

10. The semiconductor assembly of claim 9, wherein said first semiconductor die is secured to a support structure.

11. The semiconductor assembly of claim 10, wherein said support structure is a film.

12. The semiconductor assembly of claim 10, wherein said support structure is a printed circuit board.

13. The semiconductor assembly of claim 9, wherein said flowable adhesive material is epoxy.

14. The semiconductor assembly of claim 9, wherein said flowable adhesive material covers an area less than or equal to about 90% of said second semiconductor die's bottom surface area.

15. The semiconductor assembly of claim 14, wherein said flowable adhesive material covers an area greater than or equal to about 50% of said second semiconductor die's bottom surface area.

16. A semiconductor assembly comprising:
 a support structure having a top surface; and
 a first semiconductor die having a perimeters including four sides, and a top and bottom surface, said bottom surface having a smaller area than said top surface of said support structure, said first semiconductor die being secured at its bottom surface to said top surface of said support structure by a compressed flowable adhesive material which does not extend past any one of the sides of said perimeter of said at least one semiconductor die such that there is a first cavity along at least a portion of said perimeter between said support structure and said first semiconductor die, said first cavity being filled with an encapsulating material, such that only said adhesive material and said encapsulating material are between said first semiconductor die and said support structure, said top surface of said support structure having at least one electrical contact area at a distance outside said perimeter of said at least one semiconductor die, said at least one semiconductor die being in electrical communication with said at least one electrical contact area; and
a second semiconductor die having a perimeter, including four sides, and a top and bottom surface, said bottom surface having a smaller area than said top surface of said first semiconductor die, said second semiconductor die being secured at its bottom surface to said top surface of said first semiconductor die by a compressed flowable adhesive material which does not extend past any one of the sides of said perimeter of said second semiconductor die such that there is a second cavity along at least a portion of said perimeter between said first semiconductor die and said second semiconductor die, said second cavity being filled with said encapsulating material.

17. A semiconductor assembly comprising:

a support structure having a top surface; and at least one semiconductor die having a perimeter, including four sides, and a top and bottom surface, said bottom surface having a smaller area than said top surface of said support structure, said at least one semiconductor die being secured at its bottom surface to said top surface of said support structure by a flowable adhesive material which does not extend past any one of the sides of said perimeter of said at least one semiconductor die, said flowable adhesive material covering an area greater than or equal to about 50% of said at least one semiconductor die's bottom surface area, such that there is a first cavity along at least a portion of said perimeter between said support structure and said first semiconductor die, said first cavity being filled with an encapsulating material, said top surface of said support structure having at least one electrical contact area at a distance outside said perimeter of said at least one semiconductor die, said at least one semiconductor die being in electrical communication with said at least one electrical contact area; and at least a second semiconductor die having a perimeter, including four sides, and a top and bottom surface, said bottom surface having a smaller area than said top surface of said first semiconductor die, said second semiconductor die being secured at its bottom surface to said top surface of said first semiconductor die by a compressed flowable adhesive material which does not extend past any one of the sides of said perimeter of said second semiconductor die such that there is a second cavity along at least a portion of said perimeter between said first semiconductor die and said second semiconductor die, said second cavity being filled with said encapsulating material.

* * * * *

UNITED STATES PATENT AND TRADEMARK OFFICE
CERTIFICATE OF CORRECTION

PATENT NO. : 6,900,549 B2  Page 1 of 1
APPLICATION NO. : 09/760741
DATED : May 31, 2005
INVENTOR(S) : Jerry M. Brooks It is certified that error appears in the above-identified patent and that said Letters Patent is hereby corrected as shown below:

In the Specification, the following errors are corrected:

Column 1, line 31, "it Limits" should read --it limits--; and

Column 4, lines 17-18, "above. It" should read --above. As shown in Figure 7, when the adhesive fillet $24_b$ is eliminated, there can be cavities 25 between each of the second and third semiconductor dies 30, 45 and between the first semiconductor die 20 and the supporting structure 10. It--.

In Claim 9, the following is corrected:

Column 5, line 39, "arid" should read --and--.

Signed and Sealed this

Thirteenth Day of March, 2007

JON W. DUDAS
*Director of the United States Patent and Trademark Office*